(12) United States Patent
Takeda et al.

(10) Patent No.: US 6,760,472 B1
(45) Date of Patent: Jul. 6, 2004

(54) IDENTIFICATION METHOD FOR AN ARTICLE USING CRYSTAL DEFECTS

(75) Inventors: Kazuo Takeda, Tokorozawa (JP);
Aritoshi Sugimoto, Tokyo (JP);
Takanori Ninomiya, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/457,741

(22) Filed: Dec. 10, 1999

(30) Foreign Application Priority Data

Dec. 14, 1998 (JP) ............................................ 10-354155

(51) Int. Cl.[7] .............................. G06K 9/00; G06K 5/00; G06K 7/12; G06K 19/07; G01R 31/26
(52) U.S. Cl. ...................... 382/149; 382/115; 382/145; 438/16; 438/401; 235/380; 235/454; 235/460; 902/4; 902/26
(58) Field of Search .................... 438/16, 401; 235/380, 235/382, 454, 460; 382/108, 145, 149, 115; 902/4, 25, 26, 27, 28, 29

(56) References Cited

U.S. PATENT DOCUMENTS

| | | | | |
|---|---|---|---|---|
| 4,078,175 A | * | 3/1978 | Fletcher et al. ................ | 378/74 |
| 4,534,804 A | * | 8/1985 | Cade ........................... | 438/694 |
| 4,661,983 A | | 4/1987 | Knop ........................... | 382/112 |
| 4,994,142 A | * | 2/1991 | Appelbaum ................... | 438/44 |
| 5,002,902 A | * | 3/1991 | Watanabe ...................... | 438/401 |
| 5,187,118 A | * | 2/1993 | Ohmori et al. ................ | 438/618 |
| 5,286,673 A | * | 2/1994 | Nishihara ..................... | 438/401 |
| 5,325,167 A | * | 6/1994 | Melen .......................... | 356/71 |
| 5,350,715 A | * | 9/1994 | Lee .............................. | 438/16 |
| 5,481,095 A | * | 1/1996 | Mitsuda et al. .............. | 235/454 |
| 5,608,816 A | * | 3/1997 | Kawahara et al. ........... | 382/149 |
| 5,619,025 A | * | 4/1997 | Hickman et al. ............ | 235/454 |
| 5,627,356 A | * | 5/1997 | Takemoto et al. ........... | 235/381 |
| 5,843,831 A | * | 12/1998 | Chung et al. ................ | 438/401 |
| 5,844,850 A | * | 12/1998 | Tsutsui et al. ............... | 365/200 |
| 5,856,070 A | | 1/1999 | Korth ........................... | 430/320 |
| 5,917,332 A | * | 6/1999 | Chen et al. ................... | 324/765 |
| 6,049,624 A | * | 4/2000 | Wilson et al. ............... | 382/145 |
| 6,055,293 A | * | 4/2000 | Secrest ......................... | 378/70 |
| 6,121,059 A | * | 9/2000 | Liu .............................. | 438/14 |
| 6,157,444 A | * | 12/2000 | Tomita et al. ............ | 356/237.1 |
| 6,177,287 B1 | * | 1/2001 | Steffan et al. ................ | 438/14 |
| 6,218,199 B1 | * | 4/2001 | Sato ............................. | 438/14 |
| 6,362,487 B1 | * | 3/2002 | Ehlert et al. ............. | 250/458.1 |
| 6,392,289 B1 | * | 5/2002 | Tandy ......................... | 257/678 |

FOREIGN PATENT DOCUMENTS

| | | |
|---|---|---|
| JP | 63-123168 | 5/1988 |
| JP | 7-21373 | 1/1995 |
| JP | 8-31705 | 2/1996 |
| JP | 8-211215 | 8/1996 |

OTHER PUBLICATIONS

Mat. Res. Soc. Symp. Proc. vol. 442, 1997, A New Measurement Method of Micro Defects Near the Surface of Si Wafers; Optical Shallow Defect Analyzer (OSDA); K. Takeda et al, pp. 37–42.

Japan Journal of Applied Physics, vol. 37, Part 1, No. 3B, Mar. 1998, "The Analysis of the Defective Cells induced by COP in a 0.3–micron–technology Node DRAM", M. Muranaka et al, pp. 1240–1243.

* cited by examiner

*Primary Examiner*—Jingge Wu
*Assistant Examiner*—Ryan J. Hesseltine
(74) *Attorney, Agent, or Firm*—Mattingly, Stanger & Malur, P.C.

(57) ABSTRACT

A semiconductor substrate has a peculiar crystal defect. Crystal defects in a fixed area of a substrate can be treated as data acquired by coding the distribution of the crystal defects. The coded data is utilized for certificate data of an IC card by identifying a semiconductor substrate itself.

8 Claims, 12 Drawing Sheets

IDENTIFICATION METHOD FOR AN ARTICLE USING CRYSTAL DEFECTS

BACKGROUND OF THE INVENTION

The present invention relates to an identification unit and an identification method of an article.

For example, the present invention relates to a card for which money is paid beforehand and where information and functions of quantity equivalent to the paid money are coded and recorded, such as a so-called prepaid card or a digital cash card which is a type of an IC card via which money can be received and paid, Further, the present invention relates to a cash card and a credit card wherein equivalent money is withdrawn from its owner's account for a purchased article An identification system is adopted to check that a user of a card is its owner. That is, the above system includes a system of registering personal identification numbers in a card beforehand and checking whether input numbers are equal to the registered personal identification numbers or not when using the card. For such identification of a card, technology for preventing duplication and unfair use has been developed and there are well-known examples of such technology.

It is disclosed in Japanese patent laid open Hei 08-211215 to prevent duplication and forgery by utilizing etching technology in the manufacture of a semiconductor device and by using an optical diffraction structure in relation to a credit card, an identification card and others. In the above well-known example, an identification label composed of a diffraction structure formed on a substrate based upon artificial data and further, a transparent overcoat layer on the diffraction structure is disclosed. For a well-known invention using a crack for identification information, there is known U.S. Pat. No. 4,661,983.

Also, for a personal identification method and a personal identification unit in a security system for identifying a user of a card as its owner, another well-known invention uses organism information such as a finger print pattern, an iris pattern, a blood vessel pattern of an eye and a capillary vessel pattern is known. For example, a unit utilizing a finger print is disclosed in Japanese patent laid open Sho 63-123168. Further, a well-known invention utilizing a radioscopic image of a blood vessel for personal identification information is disclosed in Japanese patent laid open Hei 07-21373.

In the meantime, for a method of managing a wafer in a semiconductor device manufacturing process, a method of marking a character and a number respectively having irregularities on the surface by a laser beam and a focused ion beam (FIB) as a mark for recognition on a wafer is disclosed in Japanese patent laid open Hei 08-31705.

SUMMARY OF THE INVENTION

At present, there is technology that prevents the decoding of an ID of an IC card, duplication of an IC card and unfair use thereof as described above. In the meantime, it is also a fact that such unauthorized uses of IC cards have not been completely prevented by the current technology.

In the present invention, an article is provided with identification information for making unfair duplication and use of an unfairly duplicated article extremely difficult, and an identification unit and an identification method respectively utilizing the above identification information of the article are provided. The present invention uses a crystal defect as identification information which is extremely difficult to compose artificially.

DESCRIPTION OF THE PREFERRED EMBODIMENTS

As one of the embodiments utilizing the information of a crystal defect of the present invention, a crystal defect itself inside a semiconductor device can be utilized, however, it will be described below that it is extremely difficult to artificially forge a crystal defect inside a semiconductor device.

When a semiconductor crystal is grown, a crystal defect occurs in a crystal. The above crystal defect is a grown-in defect by oxygen precipitate that is generated by heat treatment for example. However, it is difficult to artificially control the generated position, the depth, and the size, etc. of these defects. The reason is that the generation of these defects is a phenomenon related to a diffusion phenomenon and it is difficult to control the generated position and the size of an individual defect. These defects are caused by $10^6$ pieces per 1 $cm^3$ (defect density) in a wafer created by the Czochralski method for example. It can be said that the above defect density is enough in number to utilize for identification information. It is clear that the distribution pattern of positions in which the above crystal defects exist can be utilized for information for identifying a substrate. Therefore, a substrate can be identified by generating a code using the random pattern of crystal defects which naturally occur inside the substrate.

Therefore, the defect pattern of the semiconductor substrate can be utilized for the management code of the substrate. Also, as the defects are further added to a chip through a process, identification information is increased, and can be applied to the management of the chip mounted in an IC card. Since it is difficult to duplicate a chip having the same code, unfair use of the IC card can be prevented.

Embodiment I

Described in this embodiment is an example of a defect pattern of a semiconductor substrate that is utilized for a management code of the substrate. Processes such as heat treatment, etching and further, polishing of a substrate are executed in a device manufacturing process, and when a mark is placed on the surface of the substrate it becomes deformed, discolored, damaged or erased, thereby making it difficult to recognize the mark. If the defect pattern of a semiconductor substrate is utilized for a management code of the substrate, the problem can be solved by artificially making a defect.

An example of a crystal defect that is used for a recognition pattern of a semiconductor substrate that can be detected will be described below.

Figure 1A:
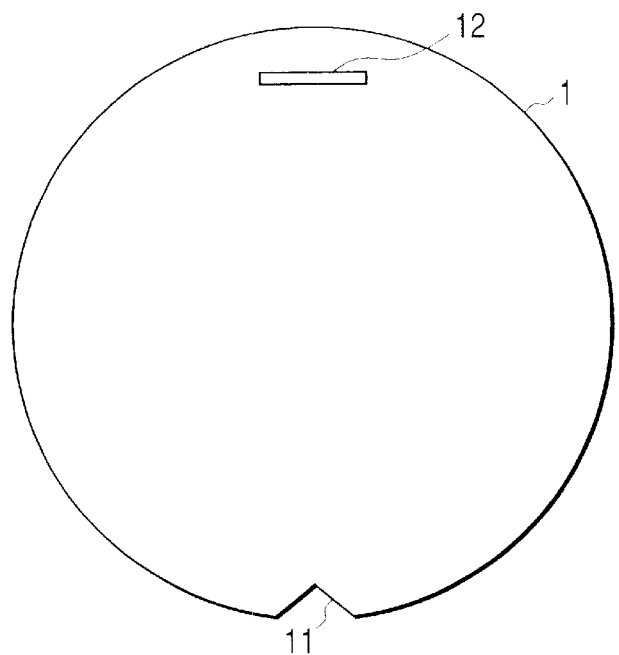
FIG. 1A shows an embodiment in which the present invention is applied to the identification of a semiconductor substrate and FIG. 1B schematically shows an example of a crystal defect which appears in an area for defect measurement set in a semiconductor substrate.
Figure 1B:
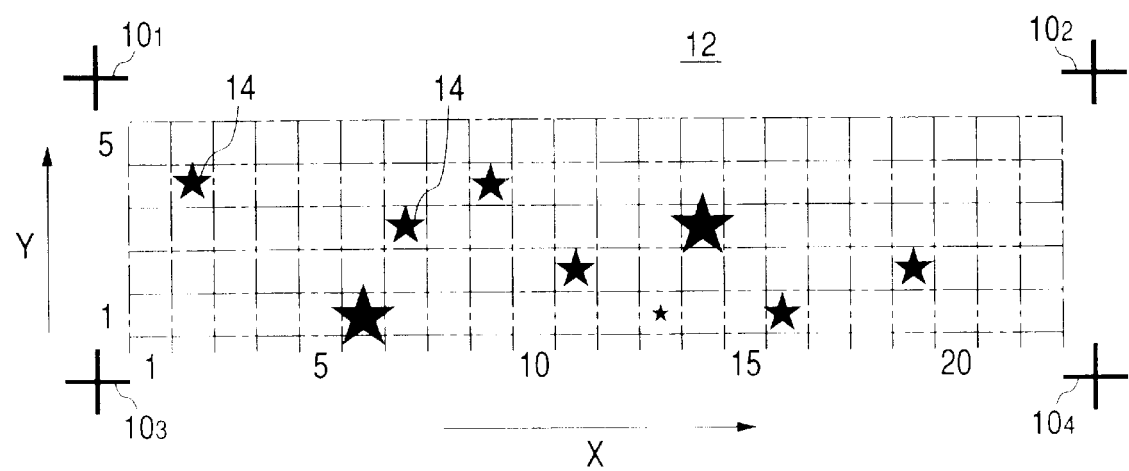

As shown in FIG. 1A, an area for defect measurement 12 is set in an area spaced apart by 5–6 mm from the periphery of a wafer 1 on the reverse side of a notch 11 in which no device pattern is formed. An example of the area 12 and an example of crystal defects which appear in the above area are schematically shown in FIG. 1B. The area 12 is surrounded by marks $10_1$ to $10_4$ in the shape of a cross showing a range for discriminating the area. An area spaced apart by a few mm from the periphery on the reverse side of the notch 11 on the surface of the wafer 1 in which no device pattern is formed is selected . The concave or convex marks $10_1$ to $10_4$ are formed on the surface of the wafer in a boundary area by a laser beam or FIB and the measurement of defects is performed using the marks as the criterion of the area 12. A concrete example of defect measurement will be described later.

In the area 12 surrounded by the marks $10_1$ to $10_4$ as shown by a star, a measured defect 14 exists. The example shown in FIG. 1B schematically shows a state in which the in plane distribution of defects in a range 0.5 μm deep from the surface is measured and enlarged. The above defects 14 do not appear of the same size but some appear large and some hardly appear at all as shown in FIG. 1B. The positions of the defects in the range of the area is shown by a broken line. The range is divided at a fixed interval in the X and Y directions and the positional coordinates of a defect are shown by the two-dimensional coordinates for every defect. Describing the use of two-dimensional coordinates is conceptual and it hardly needs be said that the two-dimensional coordinates are actually not drawn on the wafer 1. In a case shown in FIG. 1B, the two-dimensional X-Y coordinates are shown, the range is divided into 22 pieces in the X direction and into 5 pieces in the Y direction and the position of a defect is shown on the X-Y coordinates in the order of a smaller value on the x-coordinate. In this case, the position of a defect can be shown as (2, 4), (6, 1), (7, 3), (9, 4), (11, 2), (14, 3), (15, 1) and (19, 2) in the order of a smaller value on the x-coordinate. The reason why (13, 1) is ignored is that noise may occur because a signal level is low and the above coordinates are deleted in a process of signal processing. When the above coordinates of the defects are represented by a code of a hexadecimal number in order from the left, they are represented as 24-61-73-94-112-143-151-192.

These are codes generated in the correspondence of one to one based upon the defect pattern. These codes can be displayed by defect inspection equipment as a code which an operator can recognize.

As described above, an effect upon the surface which is susceptible to an artificial change such as particles on the surface and a defect on the surface can be prevented by utilizing an inside defect such as a grown-in defect inside a crystal caused when the crystal is grown, oxygen precipitate generated by heat treatment and slipband dislocation for recognizing a semiconductor chip. As the set area for defect measurement 12 has only to be an area which is not influenced by a circuit pattern, an area around the notch 11 in which no device pattern is formed may be also selected without being limited to the reverse side to the notch 11 on the surface of the above wafer 1. In the example shown in FIG. 1A, the notch is described as an example, however, it hardly need be said that an orientation flat may be used in place of the notch.

Figure 2:
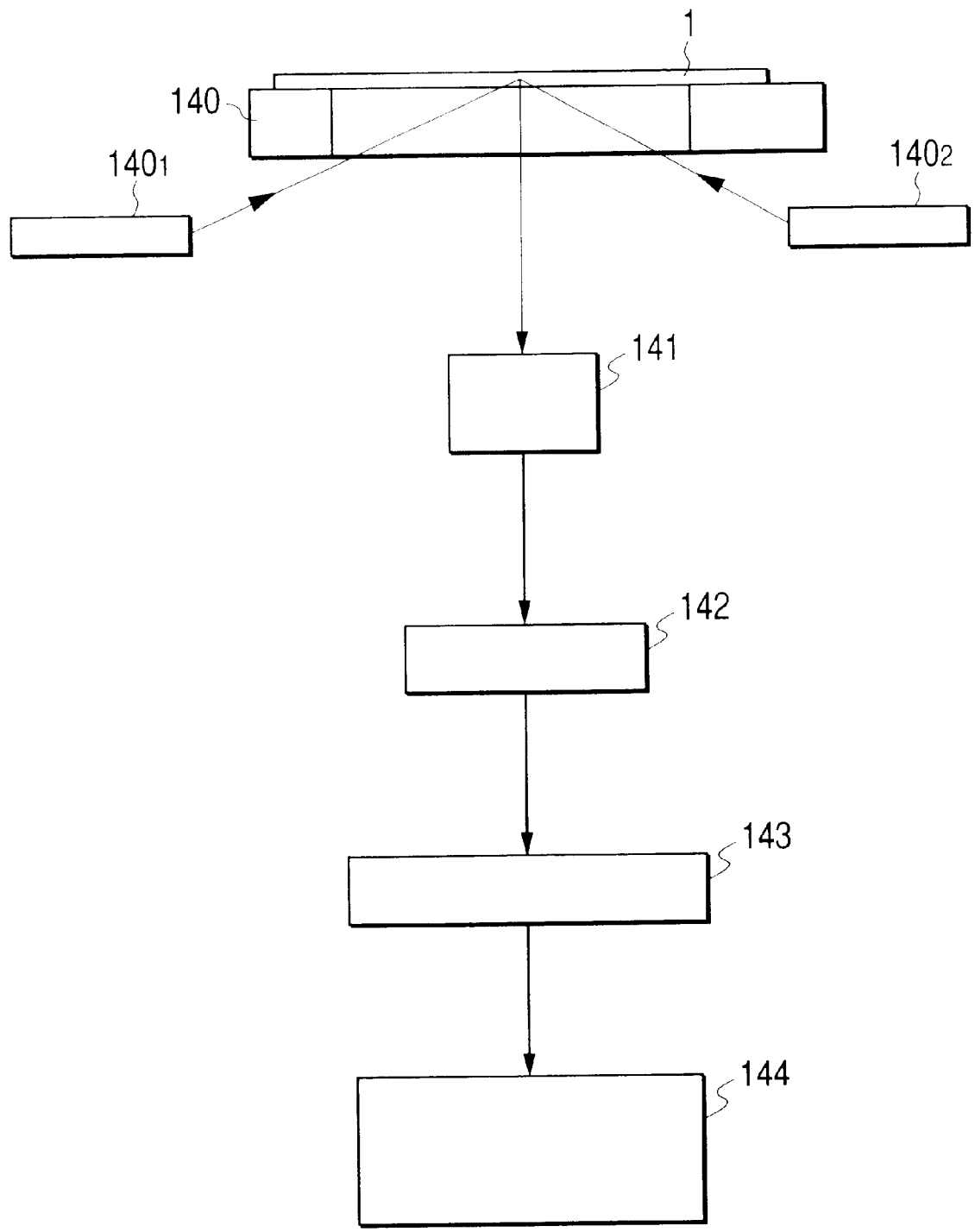
FIG. 2 is a block diagram showing an example of a unit for detecting a crystal defect.

FIG. 2 is a block diagram showing an example of a detector of a crystal defect. A stage 140 on which the wafer 1 to be measured is laid is provided and light sources 1401 and 1402 for emitting light of different wavelengths are provided under the stage. These light sources irradiate light of the respective wavelengths on the area for defect measurement 12 on the back side of the wafer 1, at alternating times. A photo image sensor 141 collects separately each wavelength scattered light from a defect on the surface or an inner defect using an optical component for a wavelength separator. The above detected scattered light intensity signal and a defect detected position are digitized and are stored in a temporary memory 142. Coding processing according to the distribution of defects is executed based upon the stored data by a data processor 143 as described referring to FIG. 1B. A display 144 displays a coded wafer ID.

Even if light is simultaneously irradiated from these light sources, the same result is acquired, however, in this case, scattered light is required to be collected via a device for separating scattered light from a defect on the surface of a sample or inside it for every wavelength of irradiated light.

A method of detecting scattered light from a defect on the surface or an inner defect for every wavelength of irradiated light by the photo image sensor 141 and evaluating the defect structure is described in detail in "A NEW MEASUREMENT METHOD OF MICRO DEFECTS NEAR SURFACE OF Si WAFERS; OPTICAL SHALLOW DEFECT ANALYZER (OSDA)" Mat. Res. Soc. Symp. Proc. Vol. 442, 1997 authored by the inventors. The photo image sensor 141 has only to be a two-dimensional detector and for example, may be also any of a photo diode array, a photo transistor array and Charge Coupled Device (CCD).

To make an adjustment so that the sensitivity of a signal detected from a wafer is fixed, it is also useful to add a mark for adjusting sensitivity to the area for defect measurement 12. That is, the signal strength for detecting a defect by the photo image sensor 141 can be corrected using a detection signal of a mark for adjusting the sensitivity as a criterion if it is checked whether a signal at an address of (13, 1) shown in FIG. 1B is effective or not. Then, the reliability for the repeatability of the measurement of signal strength can be secured. It is also useful to provide the area for defect measurement 12 in a certain fixed area on the surface reverse to the surface on which a circuit pattern is formed as the mark for adjusting sensitivity beforehand. The marks $10_1$ to $10_4$ of the area for defect measurement 12 may be also used for the mark for adjusting sensitivity. Further, the marks $10_1$ to $10_4$ of the area for defect measurement 12 shown in FIG. 1B are not necessarily required at four corners. The reason is that as these have only the meaning of defining the area for defect measurement 12, measurement is enabled if the area for defect measurement is determined beforehand and it is apparent which position and in which direction measurement is to be performed. Therefore, if a mark of '+' is provided as an example in which the mark $10_1$ is shown and it is known on which side of the mark the area 12 exists, the other three marks are not necessarily required.

This embodiment can also be applied to a semiconductor substrate made of silicon on an insulator (SOI). More concretely, this embodiment can also be applied to a semiconductor substrate provided with a first semiconductor substrate and a second semiconductor substrate and formed by oxidizing the above first semiconductor substrate, joining the oxidized first substrate and the second substrate afterward and heating them. As for the above substrate, as a circuit pattern is formed on the joined surface of the polished second substrate, the area for defect measurement 12 has only to be formed on the outside surface of the first substrate.

In this embodiment, a method of identifying without artificially providing a mark on the surface of a substrate is effective in the management of wafers by a manufacturer of wafers. Generally, the manufacturer of wafers does not desire to place a mark on a product till shipment. It is effective that management is enabled only by setting a specific position of a wafer as the area for defect measurement 12 without artificially marking. When this embodiment is applied to an SOI semiconductor substrate, there is a merit that the malfunction of a circuit pattern due to the propagation of free carriers can be prevented because the movement of free carriers by light irradiated on the backface is stopped by a layer of $SiO_2$.

Embodiment II

In this embodiment, a crystal defect in an IC chip built in an IC card is used for the ID of the IC card.

As described above, if plane resolution or reading resolution is 10 μm, an area to be identified as identification information is 10 mm×10 mm and the depth is 1 μm, the number of states in each of which 10 pieces of defects exists is $10^{60}$. Actually, the size of a chip used for a conventional IC card is 10 mm×10 mm and the thickness is approximately 50 μm. If the size of an area used for identification information is 1 mm×1 mm and the depth is 1 μm, the number of states in each of which 10 pieces of defects exist is $10^{40}$ and the number is of a quantity sufficient enough to utilize for recognition. Referring to the drawings, an embodiment in an IC card will be concretely described below.

Figure 3:
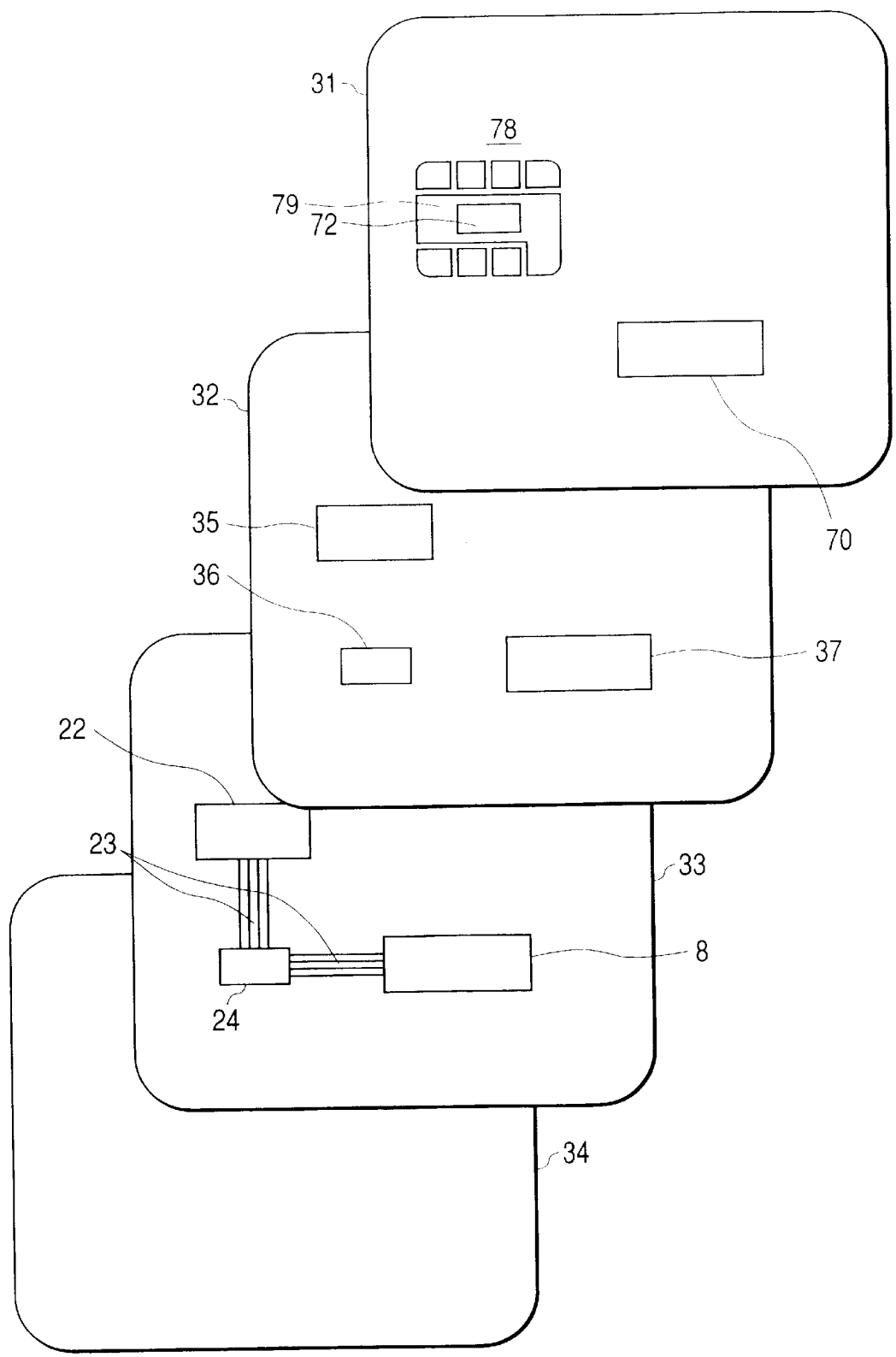
FIG. 3 explains the outline of the structure of a card in an embodiment in which the present invention is applied to the identification of an IC card.

FIG. 3 is an exploded view showing an example of a conventional IC card. In this example, four sheets shown by 31 to 34 are laminated and are shown shifted by degrees. A reference number 33 denotes a substrate sheet, a wiring pattern 23 is formed on the surface and a chip required to fulfill a function of an IC card is arranged. The above wiring pattern 23 is wiring between chips.

In this embodiment, a certificate chip 22, a control chip 24 and a photo image sensor 8 are mounted. To mount these chips on the substrate, any well-known technique may be used. A reference number 32 denotes a spacer sheet and the spacer sheet has cutouts 35, 36 and 37 corresponding to the size of each chip in positions corresponding to each chip described above. The thickness of the spacer sheet 32 approximately corresponds to the height of the chip. Reference numbers 31 and 34 denote a cover sheet and the cover sheets are arranged with the spacer sheet 32 and the substrate sheet 33 kept between the cover sheets. A group of terminals 78 for electrically connecting the certificate chip mounted on the substrate sheet 33 and an external device is provided on the outside surface of the cover sheet 31 as a generally used IC card. Since general techniques can be applied to the connection of the group of terminals 78 and the wiring pattern 23 or the certificate chip 22 and the control chip 24, the above connection is not described.

In the IC card equivalent to this embodiment, a transparent window 72 is provided in the center of a terminal 79 generally used for a grounding terminal of the group of terminals 78. Further, a transparent window 70 for inputting a finger print is provided. Though concretely described later, the transparent window 72 is provided in a position corresponding to the center of the back-surface of the certificate chip 22, crystal defects in the certificate chip 22 are detected through the window and the validity of the identification of the IC card is evaluated. The transparent window 70 is provided in a position corresponding to the photo image sensor 8, the photo image sensor 8 detects a finger print image imprinted by a user on the transparent window 70 and the validity of the user of the IC card can be evaluated.

Figure 4A:
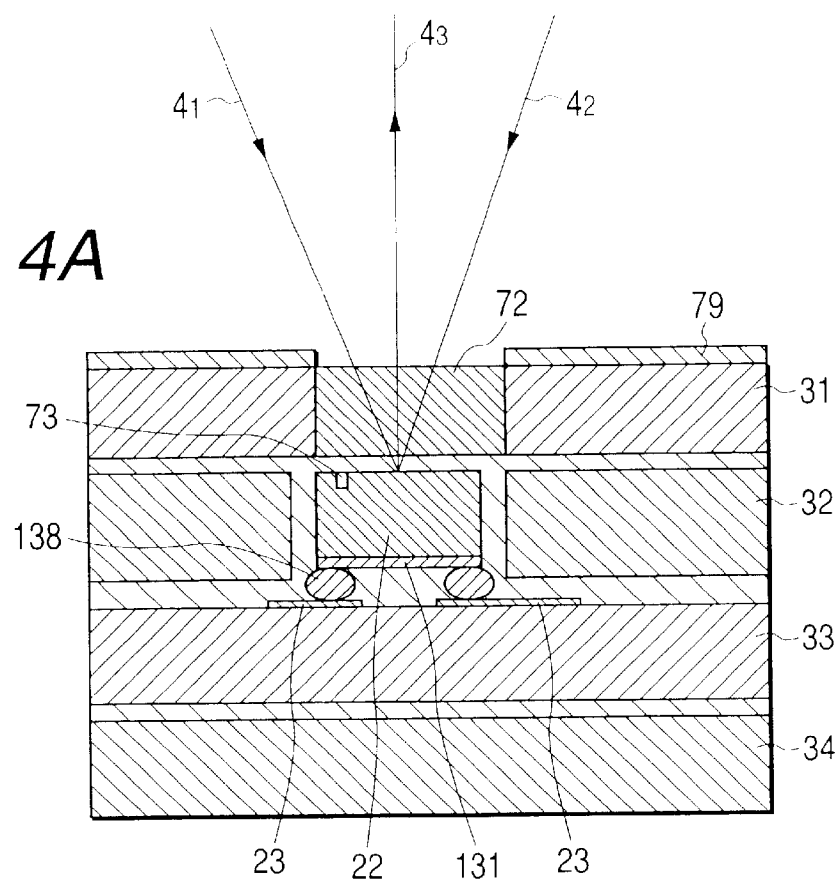
FIG. 4A is a partial sectional view showing the cross section of the IC card shown in FIG. 3 in a part of a chip for certification(a certificate chip) 22 and FIG. 4B is a partial sectional view showing the cross section of the IC card shown in FIG. 3 in a part of a photo image sensor 8.
Figure 4B:
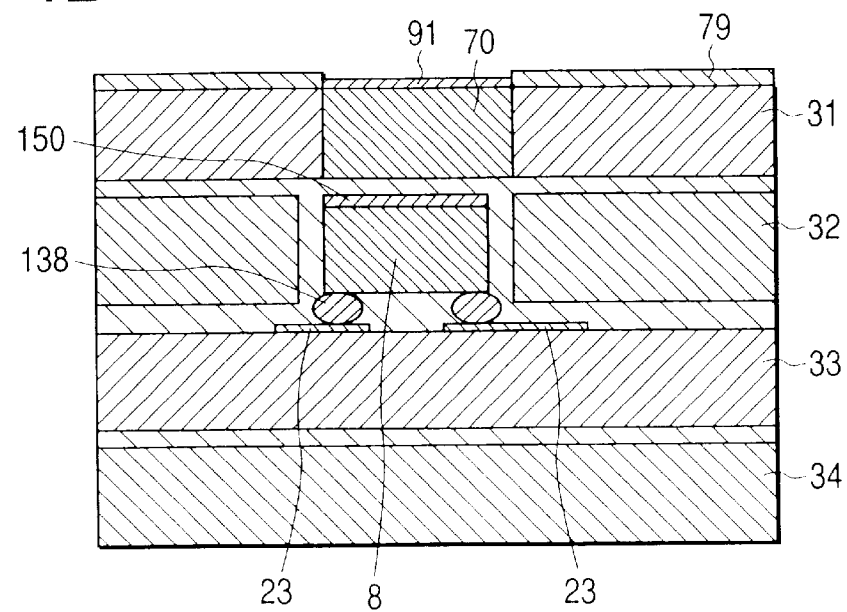

FIG. 4A is a partial sectional view cut in the part of the certificate chip 22 showing the embodiment of the IC card shown in FIG. 3. FIG. 4B is a partial sectional view cut in the part of the photo image sensor 8 showing the embodiment of the IC card shown in FIG. 3. In FIG. 4A and FIG. 4B, reference numbers 31 to 34 denote a sheet described in relation to FIG. 3. A part between each sheet shown without a reference number is an adhesive for bonding each sheet. As the adhesive for bonding the sheets 31 to 34 is required to pass light as described later, it is desirable that the adhesive is substantially transparent.

As shown by referring to FIG. 4A, the wiring pattern 23 is formed on the surface of the substrate sheet 33 and a circuit in a circuit pattern plane 131 of the certificate chip 22 is connected to the wiring pattern 23 via a bump 138. Since the backface of the certificate chip 22 corresponds to the position of the transparent window 72, the certificate chip receives light $4_1$ and $4_2$ from the outside through the transparent window 72 and reflection from the back-surface or scattered light $4_3$ from an extremely shallow layer inside the backface can be outgoing to the outside. If the above light $4_1$ and $4_2$ is light from the light sources $140_1$ and $140_2$ described in relation to FIG. 2 and reflection from the back-surface or scattered light $4_3$ from the extremely shallow layer inside the back-surface is light input to the photo image sensor 141, crystal defects in the certificate chip 22 can be detected. A cutout to which a reference number 73 is allocated on the backface of the certificate chip 22 corresponds to the marks $10_1$ to $10_4$ in the shape of '+' showing a range for discriminating an area for defect measurement 12 described in relation to FIG. 1B and in this embodiment, the above cutout is a linear cut connecting the mark $10_1$ and the mark $10_3$ in the shape of '+'. It hardly need be said that the similar effect is also acquired if the above cutout is a projection.

As seen from referring to FIG. 4B, the wiring pattern 23 is formed on the surface of the substrate sheet 33 and an output circuit of a charge coupled device (CCD) is connected to the wiring pattern 23 via the bump 138 on the side of the back of the plane 150 where the charge coupled devices (CCD) are arrayed of the photo image sensor 8. Since a technique for conducting the output circuit of the charge coupled device (CCD) to the back side is similar to a conventional technique, it is not described. Since the plane where the charge coupled devices (CCD) are arrayed of the photo image sensor 8 corresponds to the position of the transparent window 70, the plane receives light according to a finger print pattern 91 imprinted on the outside surface of the transparent window 70 through the transparent window 70. If the output of the photo image sensor 8 is collated with a finger print pattern registered beforehand by signal processing by the control chip 24 for example and it is determined whether they are coincident or not, it can be determined whether a person who imprints a finger print pattern on the transparent window 70 to use an IC card can use the IC card or not.

In this case, the finger print pattern of the valid user of the IC card is required to be registered beforehand inside the IC card and the following procedure for accomplishing this is desirable. First, when an IC card is supplied, its valid user is required to imprint his/her finger print pattern on the outside surface of a transparent member of the transparent window 70. In the state, the IC card is set on an IC card data setting terminal. The image data of the finger print pattern read at this time has only to be stored in a memory to which writing is allowed only once and from which only reading is allowed afterward and which is built in the certificate chip 22 by operating the data setting terminal. Further, in the above operation, crystal defects that are fetched from the backface of the certificate chip 22, are coded as described in relation to FIG. 1B and these codes have only to be registered as the ID of the IC card. In this case, since the ID of the IC card is used for a certificate every time the card is used, it is required to be registered in a section accessible in common via a network such as a certificate authority to be described later in relation to FIG. 8. As the conventional data setting terminal of an IC card is not provided with a function for irradiating light on an IC card, a setting terminal is required to be provided with an optical system with which a card reader (to be described in an embodiment is provided to actually use the IC card equivalent to this embodiment. A reason why the image data of a finger print pattern is stored in the memory built in the certificate chip 22 is that it is more effective for enhancing security because data which should not be falsified is stored in the certificate chip 22 and the validity of an IC card is evaluated based upon crystal defects in the certificate chip 22 in this embodiment. Therefore, if the image data of a finger print pattern is stored in a memory built in the control chip 24, a function of certifying the validity of the user in an IC card can be also realized.

As in this embodiment, it is also useful to use a conventional type certification method by personal identification numbers (a certification method by a scrambled code realized by software depending upon a private key such as RAS) together in addition to evaluating the validity of an IC card based upon crystal defects in the certificate chip 22. In some instances, only certification by personal identification numbers is executed, then the IC card can be simply used.

In the embodiment shown in FIG. 4A and FIG. 4B, the transparent windows 72 and 70 are formed by cutting out the cover sheet 31 and fitting in a transparent member such as quartz glass. For example, a layer of a transparent member such as quartz glass is provided between the cover sheet 31 and the spacer sheet 32 and a thin cover sheet 31 a cut out part corresponding to a transparent window may be also provided on the transparent layer.

Figure 5A:
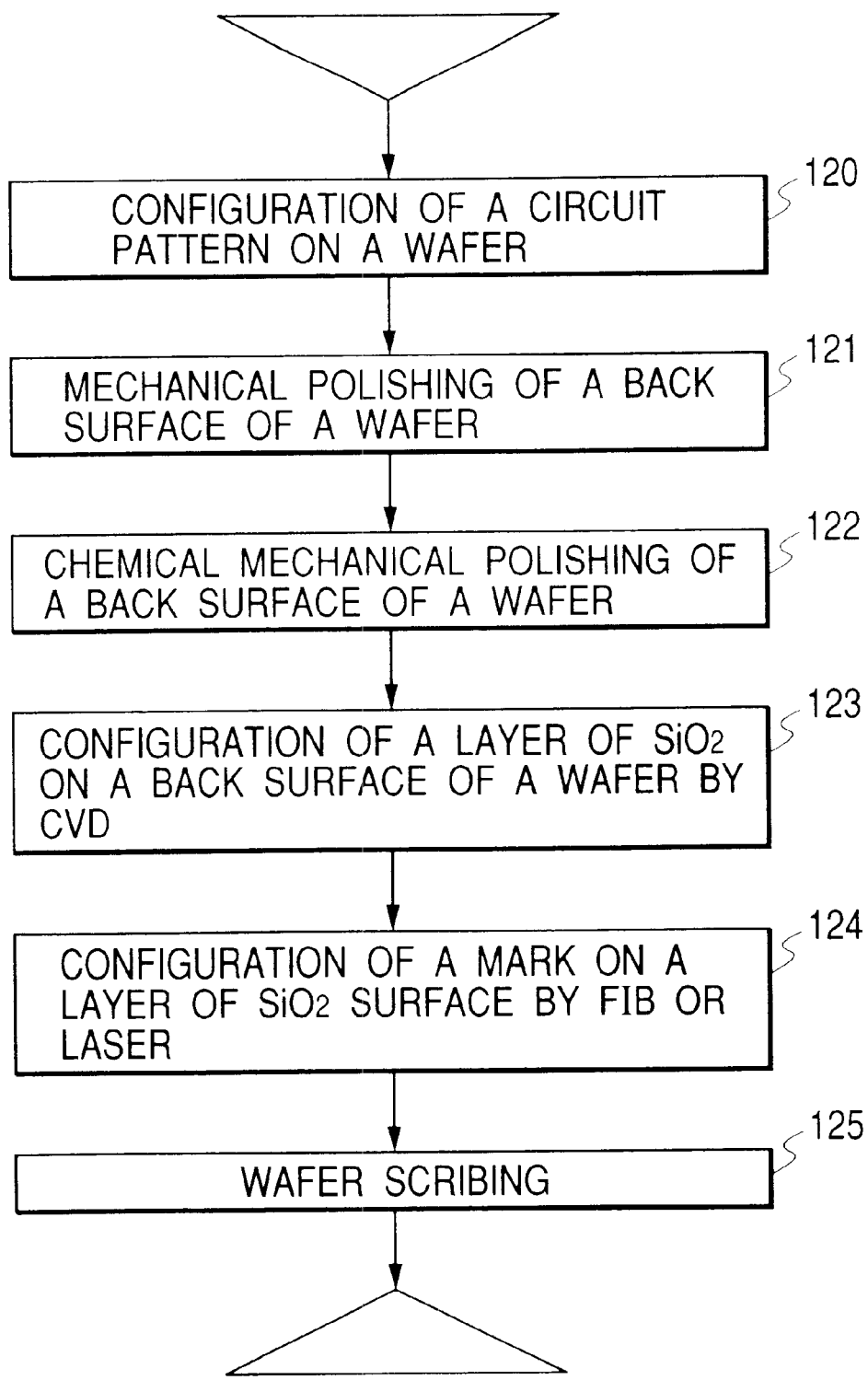
FIG. 5A and FIG. 5B show the outline of the change of a wafer in a processing flow and each process in an example of a process for manufacturing the certificate chip 22.
Figure 5B:
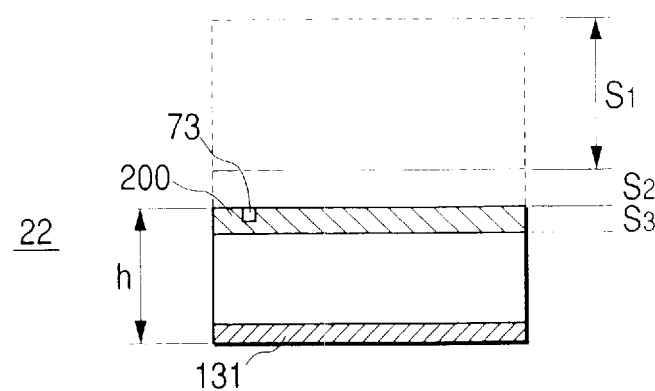

FIG. 5A and FIG. 5B respectively show a processing flow as an example of a process for manufacturing the certificate chip 22 and the outline of the change of a wafer in each process. In a step 120, a device is produced on the surface of a wafer. After the device is completed, a part $S_1$ on the backface of the wafer is mechanically polished and is thinned in a step 121. Afterward, in a step 122, mirror polish is applied to a part $S_2$ by chemical mechanical polishing (CMP), followed by etching of the part. Afterward, in a step 123, a part $S_3$ on the back-surface of the wafer is covered with an oxide film 200 by CVD. Afterward, in a step 124, a cutout 73 is provided on the outside surface of the oxide film 200 by FIB or a laser beam. The cutout 73 is provided to specify the area for defect measurement 12 as described above. Afterward, in a step 125, the wafer is cut into chips. As described above, a certificate chip 22 having desired size and thickness h is completed.

For the thickness of the certificate chip 22, a desired height h is acquired by processing the surface differently from the surface on which the circuit pattern 131 is provided by chemical etching after mechanical polishing. Concretely, the wafer is thinned to approximately 50 μm, however, it can be thinned to 30 μm. For the thickness of the whole IC card, 0.85 mm is generally the standard, however, if the thickness of the certificate chip 22, the cover sheets 31 and 34 and the spacer sheet 32 is suitably selected, the whole IC card can be thinned to 0.15 mm.

If the whole IC card is thinned to such a small value, the value can be a dimension sufficient for using crystal defects for the IC of the certificate chip. Crystal defects utilized for the ID of the certificate chip 22 will be described below.

In the first embodiment, crystal defects in a wafer itself and the ID of the wafer utilizing them are described. However, as is well known, crystal defects are further increased when processing is applied to a wafer. As described in relation to FIG. 5A, heat treatment is applied to the certificate chip 22 in the manufacturing process. $SiO_2$ particles are generated inside the silicon wafer by heat treatment in the process. For the density of the generated $SiO_2$ particles, it is known that at least $10^8$ pieces/cm$^3$ are generated inside in the processing for forming the nucleus of $SiO_2$ (four hours at 800° C.) which is model annealing of a wafer generally performed and in heat treatment for forming $SiO_2$ (16 hours at 1000° C.). The oxygen precipitate is generated deep to some extent from the surface, however, even within 50 μm from the surface, the sufficient density of precipitate is acquired. For example, if volume density is $10^8$ pieces/cm$^3$, surface density is $10^2$ pieces/mm$^2$ within 1 μm from the backface. Defects are by far more than those when a wafer is generated.

That is, in the certificate chip 22, oxygen precipitate of sufficient density generated in heat treatment in the process can be detected if crystal defects are detected from the backface and crystal defects have sufficient quantity of information as ID.

It is described that in this embodiment, the certificate chip 22 and the control chip 24 are provided, however, these can be also integrated and further, it hardly need be said that a processor function for executing image processing for the output of a charge coupled device (CCD) may be added to the photo image sensor 8.

Figure 6:
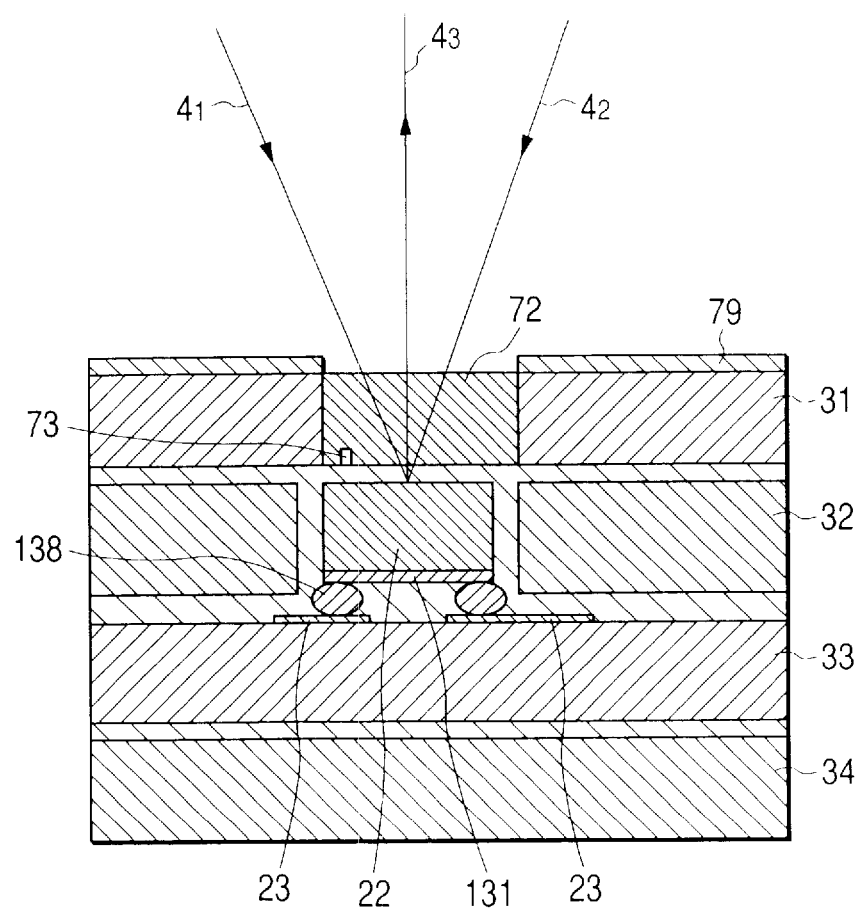
FIG. 6 shows an example in which a position where a mark showing an area for defect measurement is provided is changed.

FIG. 6 shows an example that a mark 73 is provided on the side of the lower surface of a transparent member fitted into the transparent window 72, that is, on the side opposite to the backface of the certificate chip 22 in place of producing the mark 73 for specifying the area for defect measurement 12 on the backface of the certificate chip 22. In this case, the step 124 described in relation to FIG. 5A can be omitted.

Embodiment III

Figure 7:
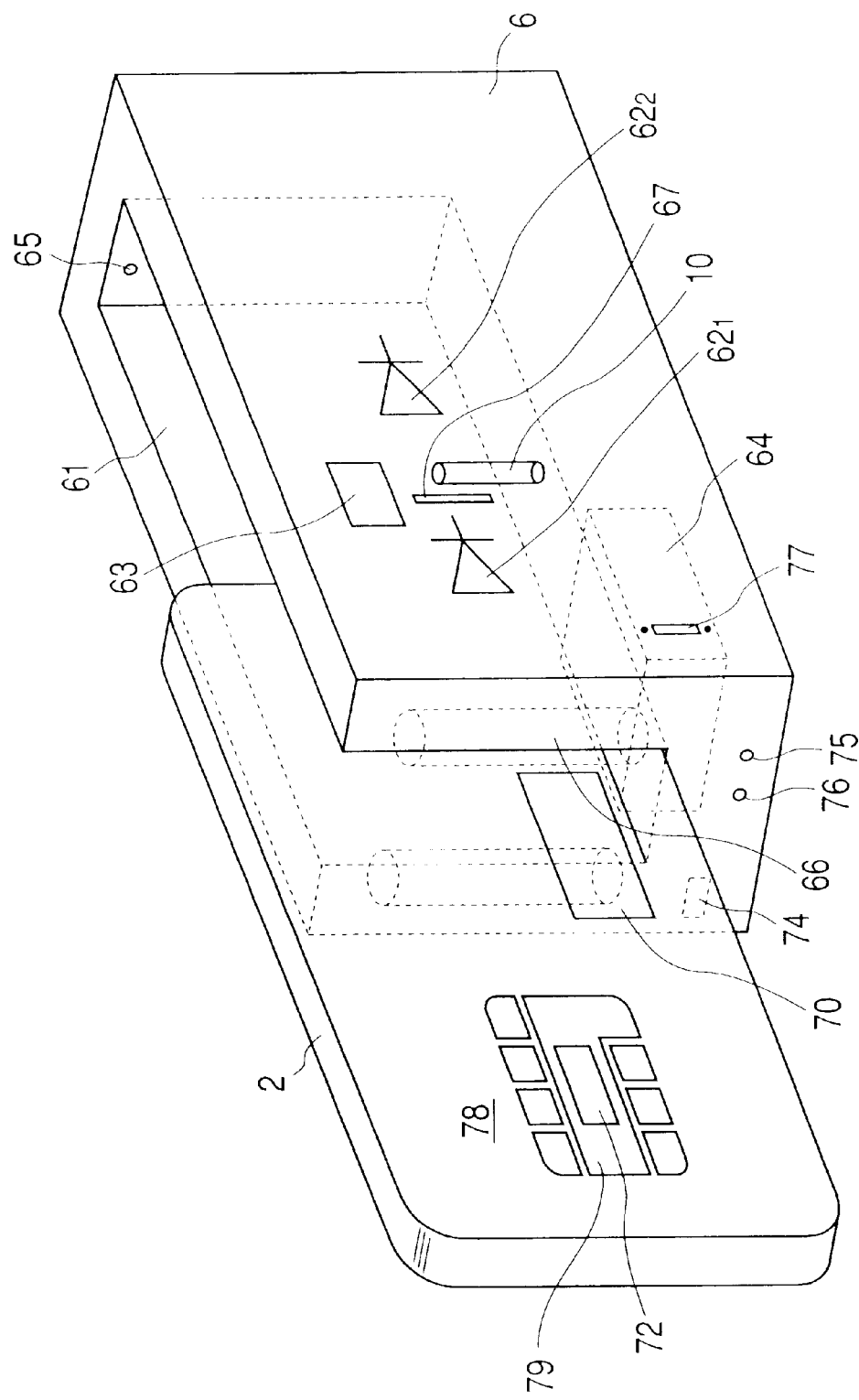
FIG. 7 is a schematic perspective view for explaining an IC card reader explained in FIG. 3.

FIG. 7 is a schematic perspective view for explaining an IC card reader described in relation to FIG. 3. A reference number 6 denotes a card reader and 2 denotes an IC card. A group of terminals 78, a transparent window 72 and a transparent window 70 are seen on the surface of the IC card.

As described above, the transparent window 72 is provided to detect crystal defects in the certificate chip 22 and to evaluate the validity of ID of an IC card. The transparent window 70 is provided to detect a finger print image and to evaluate the validity of a card owner. Light sources $62_1$ and $62_2$ and a photo image sensor 63 are attached on the inner wall of the card reader 6 opposite to the side of the surface of the IC card 2, that is, the surface having the transparent windows 72 and 70. Further, on this inner wall, a light source 10 is attached and a slit 67 is formed. A reference number 61 denotes space for a card and the space for a card functions as a guide for inserting the IC card 2 into the card reader. A reference number 66 denotes a roller and it is provided to feed the IC card 2 into the space for a card 61 of the card reader 6. A reference number 65 denotes a sensor for stop of moving and it is provided to detect that the IC card 2 reaches a position for the card to be stopped. A reference number 74 denotes a verification switch and it is turned on after the IC card 2 is set in the space for a card 61 of the card reader 6. A reference number 64 denotes a data processor, it corresponds to the temporary memory 142 and the data processor 143 described in relation to FIG. 2 and processes the output of the photo image sensor 63. Reference numbers 75 and 76 denote a display and it displays the output of the data processor 64. A reference number 77 denotes a connector and it is used for connecting the card reader 6 to a controller as described later and sending the output to a center via a network. Though not shown, a contact for coming in contact with the group of terminals 78 of the IC card 2, reading data and others stored in a memory inside the card and sending data to the card from the controller if necessary is provided to the card reader 6.

The IC card reader 6 is used as follows. When the IC card 2 is set in the space for a card 61 of the card reader 6 and the verification switch 74 is turned on, the rollers 66 provided on both sides of the space for a card 61 are rotated by a driving motor not shown and feed the IC card 2 to the inside of the space for a card. When the IC card 2 reaches a predetermined position, the sensor for stop of moving 65 is operated and the IC card 2 is stopped. Until the IC card 2 is stopped since it is inserted into the space for a card 61, light is irradiated on the side of the surface of the IC card 2, that is, the transparent window 72 from the light sources $62_1$, $62_2$ and 10. Light from the light sources $62_1$ and $62_2$ irradiates the back-surface of the certificate chip 22 as described in relation to FIG. 4A or 6 through the transparent window 72 as described in relation to FIG. 2 and the position of the light sources $62_1$ and $62_2$ is determined so that the required surface can be irradiated while the IC card moves. Similarly, light from the light source 10 is irradiated on the transparent window 70 through the slit 67. The position of the light source 10 and the slit 67 is determined so that the required surface can be irradiated while the IC card moves.

Until the IC card 2 is stopped since it is inserted into the space for a card 61, light from the respective light sources is irradiated on the transparent windows 72 and 70. Therefore, the photo image sensor 63 can detect information in an area for defect measurement 12 specified by the mark 73 on the back-surface of the certificate chip 22 and data for determining whether the IC card is suitably issued or not can be output by processing the output by the data processor 64. It can be determined inside the IC card 2, for example by the control chip 24 from light irradiated through the transparent window 70 whether a finger print image imprinted on the transparent window 70 is coincident with a finger print registered when the IC card is issued or not. The result of processing by the data processor 64 and the result output from the group of terminals 78 via the contact of collating finger print images are displayed on the displays 75 and 76 if necessary. Needless to say, the above results may be also displayed on the controller connected via the connector 77.

When the certification of the IC card 2 and required input processing by the controller are finished, the verification switch 74 is turned off for example, the rollers 66 are reversed and the IC card is ejected from the space for a card 61 of the card reader 6.

As clear from the above description, in this embodiment, a finger print image is only stored in an IC card when the IC card is issued. Therefore, since the finger print image can be prevented from being sent to a bank, a corporate body such as a company or an institute, as data via a network every time an IC card is used, the leakage of private information of an individual and the risk of unfair use can be reduced.

Embodiment IV

Figure 8A:
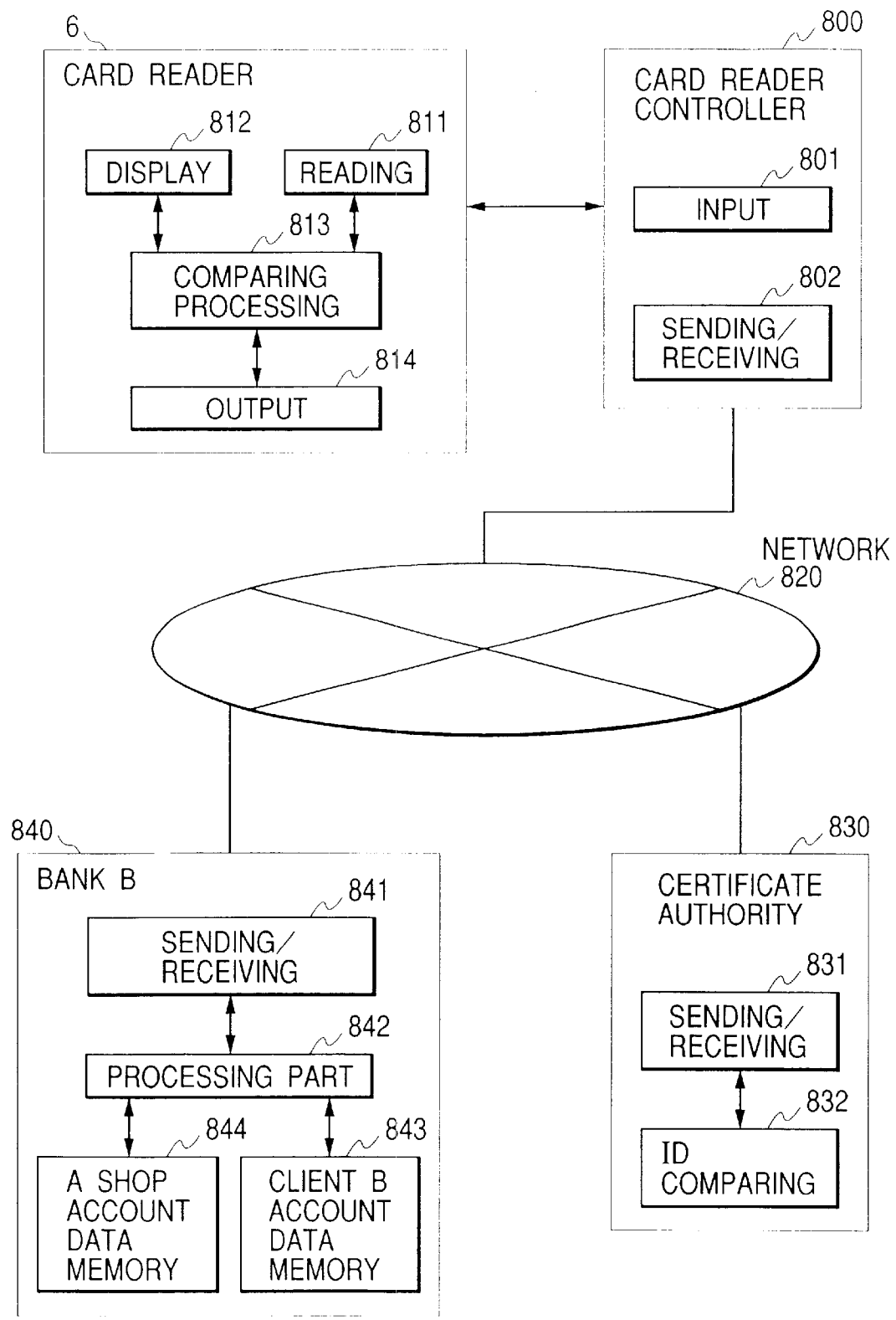
FIG. 8A shows the configuration of the whole system for explaining an example of a method of using the IC card and the card reader in this embodiment and FIG. 8B is a flowchart showing an example of signal processing in the card reader.
Figure 8B:
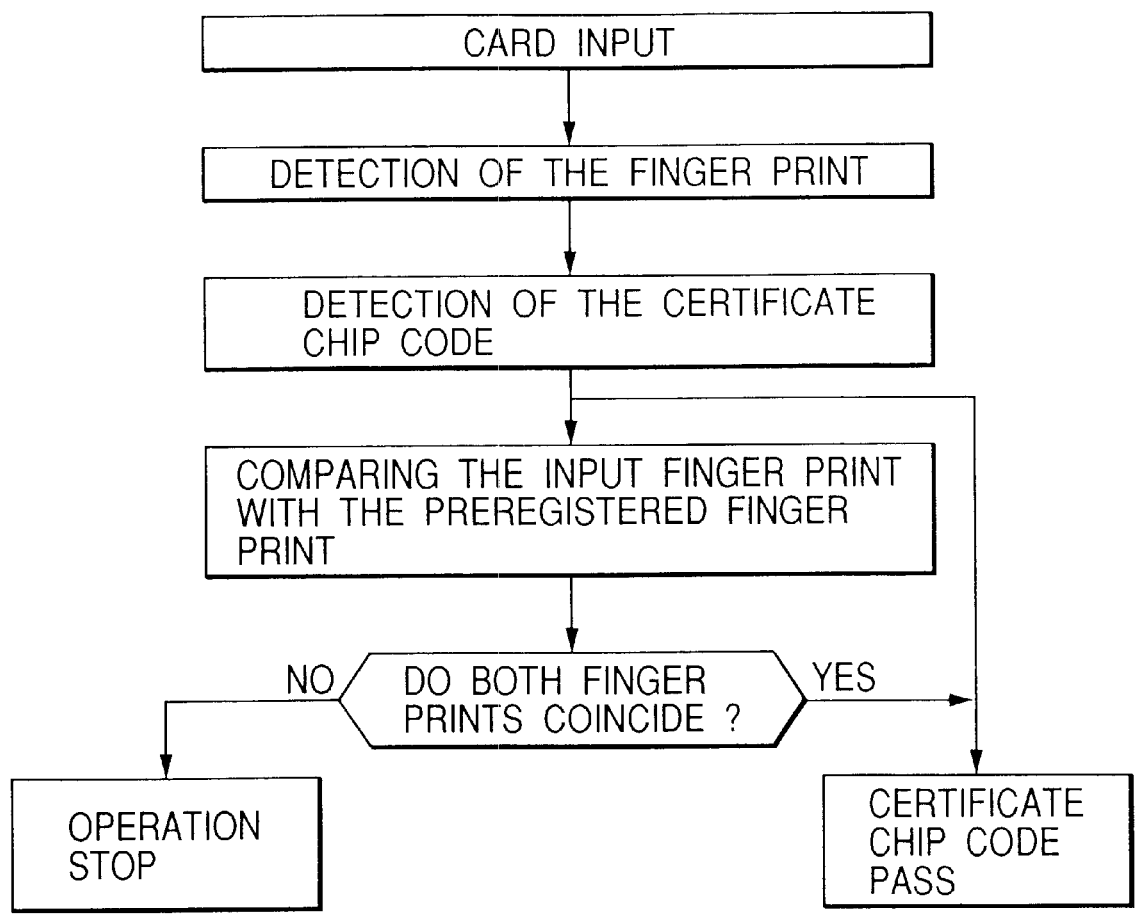

FIG. 8A shows the configuration of the whole system for explaining an example of a method of using an IC card and a card reader in this embodiment and FIG. 8B is a flowchart showing an example of signal processing inside the card reader. A reference number 800 denotes a card reader controller and it is used for providing information required for a card reader 6 and a system and extracting a signal read by the card reader 6. A reference number 801 denotes an input section and 802 denotes a transmitter-receiver. The card reader 6 is composed of a reading section 811 mainly comprising the above light sources $62_1$, $62_2$ and 10 and a photo image sensor 63, a display section 812 mainly comprising displays 575 and 576, a comparing processing section 813 mainly comprising a data processor 64 and an output section 814.

A reference number 820 denotes a network and the controller 800 is connected to the network 820.

A reference number 830 denotes a certificate authority, it is connected to a network 820 and fulfills a function for certifying whether a code detected in an area for defect measurement 12 of the IC card and sent is coincident with an IC code registered when the IC card is issued or not. A reference number 831 denotes a transmitter-receiver and 832 denotes an ID collator.

A reference number 840 denotes a bank B, it is connected to the network 820 and processes according to information of the receipt and payment of money sent from the controller 800 and information sent from the certificate authority. A reference number 841 denotes a transmitter-receiver, 842 denotes a processor and 844 and 845 are a client account data memory.

Suppose that a client K buys a merchandise C at a shop A and pays by withdrawing from his/her account in the bank B using his/her IC card. At the shop A, after the client K is asked to imprint his/her finger print on the transparent window 70 and imprints it, his/her IC card is received. It is inserted into the IC card reader 6 described in relation to FIG. 7. As a result, inside the card reader 6, the finger print image imprinted on the transparent window 70 is detected, an ID code read in the area for defect measurement 12 of the certificate chip 22 from the backface of the IC card is detected and the collation of the finger print, that is, the detected finger print image and a finger print image registered beforehand are compared. It is judged in the comparing processing section 813 by the above collation of the finger prints whether the user of the card is a valid owner or not and the result is displayed in the display section 812. At this time, if the collated finger prints are coincident, that is, the user of the card is a valid owner, the ID code of the certificate chip 22 is also sent to the controller 800 via the output section 814. If the collated finger prints are not coincident, that is, the user of the card is not a valid owner, the succeeding processing is prohibited. FIG. 8B shows the flow of the above signal processing. If it is displayed that the user of the card is a valid owner, a salesperson of the shop A inputs the price of the merchandise C via the input section 801. As a result, the price of the merchandise C, the read ID code and the data of an account for payment registered when the card is issued and others are sent to the network 820 via the transmitter 802. The certificate authority 830 determines whether the ID code is the one registered when the card is issued or not when the certificate authority receives the read ID code and sends the result to the network 820. When the bank B receives the data of the account for payment, it waits for the result of certification from the certificate authority 830, if it is determined that the user of the card is valid, the sum of money equivalent to the price is subtracted from the owner's account data 843 and is added to the account data of the shop A 844. When payment processing by the bank B is finished, the result is sent to the controller 800 of the shop A, the card is ejected from the card reader at the shop A and is returned to the client K. If the account of the shop A is not provided to the bank B, it hardly need be said that processing for receiving money is executed in another bank having the account of the shop A and connected to the network. That is, according to this embodiment, as the validity of the user of the card is evaluated in collating finger prints and the validity of the IC card is evaluated in ID of the certificate chip 22, security is checked doubly. In addition, as described above, if the data of a finger print image is stored in the certificate chip 22, an unauthorized user cannot pass the double check even if the certificate chip is unfairly replaced.

In the meantime, as the above certificate authority only exists as a part of the function of the bank if the above system is applied only in a specific bank system, and the certificate authority 830 has only to exist in the bank system.

As described above, if the validity of the IC card can be also evaluated based upon personal identification numbers generally used at present in addition to the ID code of the certificate chip 22 read in the area for defect measurement 12 from the backface of the IC card, only processing based upon personal identification numbers may be also executed when the price of the purchased merchandise is smaller than a predetermined price. As a load of the network can be reduced in such a state, there is an advantage that security is sufficient even if the system becomes large scale.

Embodiment V

In the above embodiments, an area for defect measurement 12 is set on the backface of the substrate on which the circuit pattern is formed and a code acquired from crystal defects in the area is used for the ID of the card. In this embodiment, not crystal defects themselves but a fail bit pattern of a memory caused by crystal defects is used for recognition. When a memory device is produced, fail bits occur, however, the number of fail bits per one chip can be reduced in an approximately fixed range by mounting it on a wafer produced according to the Czochralski process in which the density of defects of which is controlled. It is known that crystal defects have a bad effect upon the electric characteristic of a device and cause failure (refer to "The Analysis of the Defective Cells Induced by COP in a 0.3-micron-technology Node DRAM" by M. MURANAKA et al., JJAP37(1998) 1240–1243). A defect can be detected based upon the failure of the electric characteristic of the memory device. That is, as a fail bit map of a memory device based upon the failure of the electric characteristic of the memory device represents a crystal defect (including a defect caused by damage from a process) and the same cannot be artificially produced, the fail bit map can be utilized for a code for recognizing a semiconductor chip. As there are various types of memory devices and they are different in the density of fail bits, memory devices (DRAM, SRAM, EEPROM a flash memory, FRAM or a magnetic memory and others) different in the level of integration may be also used and a part of the address space information may be also used.

In this embodiment, as the fail bit pattern of a memory device in an IC card is required to be measured, an optical system described in relation to FIG. 7 is not required, however, in place, a code corresponding to the fail bit pattern is required to be read via a group of terminals 78 for example and is required to be registered in a certificate authority. For a fail bit pattern, a method of measuring the pattern as a digital value with an IC tester that determines whether a characteristic bit is 0 or 1 (showing good or bad) and records this result together with its address and a method of multivaluing the analog electric characteristic of a device corresponding to the one address and recording it are enabled.

In this case, for a generated code of an IC card, 1) a case that the address of a fail bit is coded and 2) a case that the address of a fail bit and the degree of failure of the bit (the case of multivalued recording) are possible, however, to prevent copying, the latter code is deemed more secure. To briefly explain the above, the explanation is as follows. The possibility of copying of a chip in which the address of the fail bit is known is considered and a mask for a semiconductor device is produced so that a bit at the fail bit address fails and a memory is produced. However, even if a device is produced using the above mask, the reason why the latter code is more secure is that it is impossible to reproduce the characteristic of a fail bit, aside from reproducing the array of fail bits.

Figure 9A:
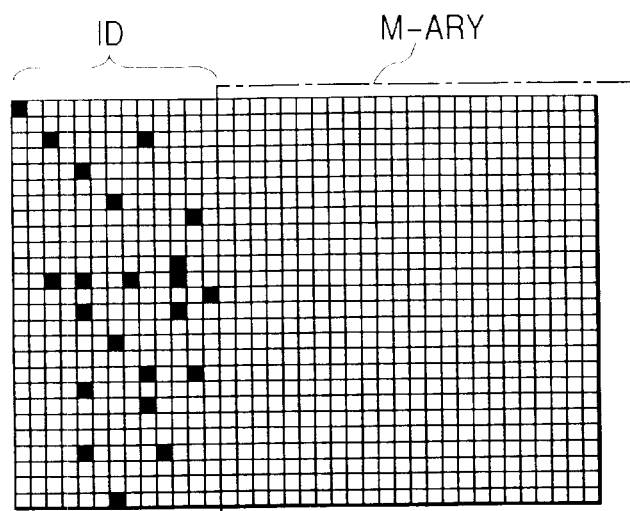
FIG. 9A, FIG. 9B and FIG. 9C are schematic drawings for explaining a group of memory elements in which a fail bit occurs such as DRAM, SRAM and a flash memory.
Figure 9B:
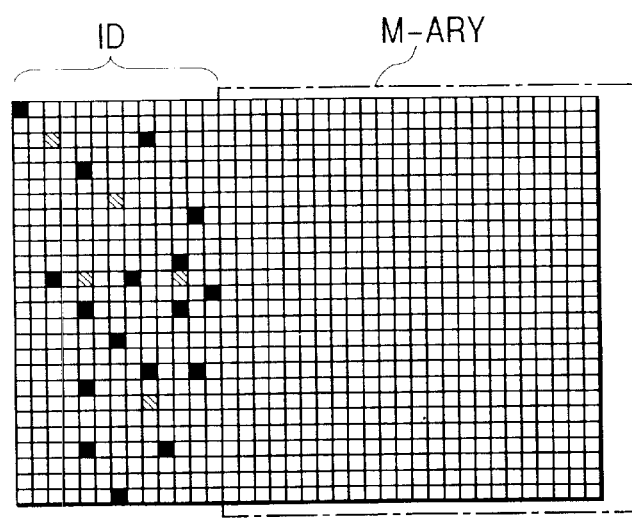
Figure 9C:
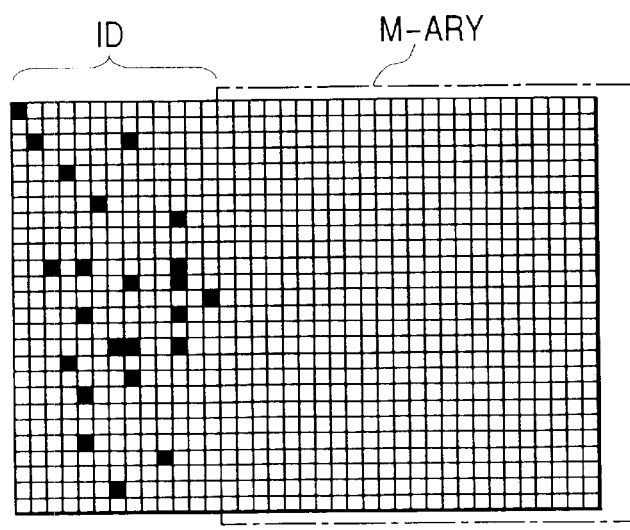

Referring to FIG. 9A, FIG. 9B and FIG. 9C, a method of utilizing an electric defect random pattern will be more concretely described below.

FIG. 9A, FIG. 9B and FIG. 9C are schematic drawings for explaining a group of memory devices where a fail bit occurs such as DRAM, SRAM, EEPROM and a flash memory. As shown in FIG. 9A, FIG. 9B and FIG. 9C, a two-dimensional area divided into small parts is an area used for a memory and each part denotes one bit of the memory. When the memory is produced, fail bits occur with them being dispersed in the whole area. That is, as a black part or a hatched part in an area ID equivalent to ⅓ from the left in the memory area is shown, fail bits occur in the whole area at statistic probability. In the meantime, as for an area M-ARY equivalent to ⅔ shown by an alternate long and short dash line on the right side of the memory area and bit relief is applied as performed in a general memory so that no fail bit seems to exist. That is, to fulfill a proper function as a memory, no fail bit is made to seem to exist by using a normal memory bit existing outside a memory area in place of a fail bit in the memory area by processing by software.

FIG. 9A shows the distribution of fail bits of binary data in a memory and a black bit means that it is a bit which does not normally store. FIG. 9B shows an example that though data itself in a memory is binary, two thresholds are provided to judge whether a bit in the memory is a fail bit or not. A black bit also means that it is a bit which does not normally store, however, a hatched bit means that it shows storage output to some extent though it is a bit which does not normally store. As seen when FIG. 9A and FIG. 9B are compared, as a fail bit different in a character from a fail bit shown in FIG. 9A exists in FIG. 9B, and stricter certification is enabled by identifying both. FIG. 9C shows the same memory as that shown in FIG. 9A, however, it shows a schematic drawing of a case that thresholds for judging a fail bit are different. As is clear when both are compared, even if the memories are the same, fail bit patterns are different.

As described above, a fail bit pattern acquired corresponding to a certain electric characteristic such as a leakage current value and threshold voltage for an address can be used for certification. The whole memory is not required to be used for address space used for certification and a part has only to be used. It is desirable that address space is changed by security. For certification, it is desirable that a memory for recording important data and a certificate pattern (the copying of which is impossible) exist in the same chip. From this viewpoint, for a memory, a nonvolatile memory is convenient and it is desirable that an area of a memory is used for certification and another area is used for reading, writing or storing data.

As described above, if failure which occurs in a process for manufacturing a memory is used for certification, more reliable certification is enabled in case measures to prevent unfair forgery are taken.

It is conceivable that a memory is produced using a mask such as an element corresponding to the address of a fail bit fails if the fail bit is artificially made and an IC card is unfairly produced. That is, it is conceivable that the element corresponding to the address is incompletely formed or no element is formed. However, according to this method, though fail bits can be made, it is actually impossible to reproduce its electric characteristic. Therefore, it is more difficult to reproduce a pattern shown in FIG. 9B. Also, for another method, a method of replacing the address of a fail bit to be made with another bit is conceivable in place of using the mask described above. This technique is used for a method of bit relief even at present and the operation of replacing the address of a fail bit with the address of a non-defective bit is actually performed by software. As various fail bit patterns are generated by software when the above replacement is allowed, it is effective to substantially prohibit the above replacement. One of those methods is to add temporal constraint to calling a fail bit pattern. Hereby, time to spare for processing by software required for replacing bits is lost and unfair use can be prevented.

In the meantime, when the prevention of unfairness is viewed from a point of detecting an electric characteristic, a method of converting the magnitude of a leakage current value from a gate insulating film of a transistor caused by defects in an oxide film under fixed applied strength for every address from analog to digital and acquiring a pattern of the value for every address and a method of combining some writing bias voltage in a flash memory, converting the voltage (Vt) of a memory cell in fixed time after writing from analog to digital and acquiring a pattern of the value every address are enabled. As examples shown in FIG. 9A and FIG. 9C, in a flash memory, writing voltage is varied and the variation (variation from a pattern shown in FIG. 9A to a pattern shown in FIG. 9C) of a binary fail bit pattern of a memory cell can be also used for a certificate pattern. In this method, concretely, bias is varied and a fail bit pattern has only to be acquired. It is desirable that a certificate authority specifies the quality of applied bias. In this case, it hardly need be said that the condition of bias and a fail bit pattern are required to be registered in a certificate authority. That is, when an IC card is issued, these conditions are specified by a certificate authority and a fail bit map is registered. It is the same as a case that crystal defects themselves are used for certification that when an IC card is used, a pattern registered in a certificate authority and a pattern sent from a reader are collated.

Modifications

In the above embodiments, an area for defect measurement 12 is set, however, a circuit pattern itself can be utilized for data for setting the area for defect measurement 12. That is, a code acquired from crystal defects in a specific area based upon a circuit pattern on the surface of a substrate on which the circuit pattern is formed is used for ID of a card. As described above, in an epitaxial wafer where an epitaxial layer is provided on a wafer produced according to th eCzochralski process, so many crystal defects do not exist in the epitaxial film, compared with a wafer produced according to Czochralski process to which heat treatment is applied. The density is $10^4$ pieces per 1 $cm^3$ and as the similar high density defects to a wafer produced according to the Czochralski process can be utilized if crystal defects are detected from the backface of a wafer, there is no problem. In the case of a wafer produced according to the Czochralski process, as defect density is high in an area of the surface and the area for defect measurement 12 can be set on the surface, labor for producing a mark 73 can be omitted.

To detect defects from the surface of a substrate, the area for defect measurement 12 may be also set in an area different from an area in which a circuit pattern is formed on the surface of the substrate in place of utilizing the circuit pattern itself for data for setting the area for defect measurement 12. In this case, as the utilization of the backface, it hardly need be said that a mark showing the area 12 is required to be placed.

In the above embodiments, in the IC card, to enable the certification of the user himself/herself of a card, the transparent window 70 is provided so that the user can be certificated utilizing his/her finger print in addition to card ID, however, to certificate an IC card itself, the transparent window is not necessarily required, in that case, the IC card is simplified and the card reader 6 can be also simplified by the quantity.

Some mounting methods in case a certificate chip 22 is built in an IC card will be described below. These mounting methods can be similarly applied to a control chip 24 or a photo image sensor 8.

FIG. 10A to FIG. 10D show examples of a method of building a certificate chip in an IC card.

Figure 10A:
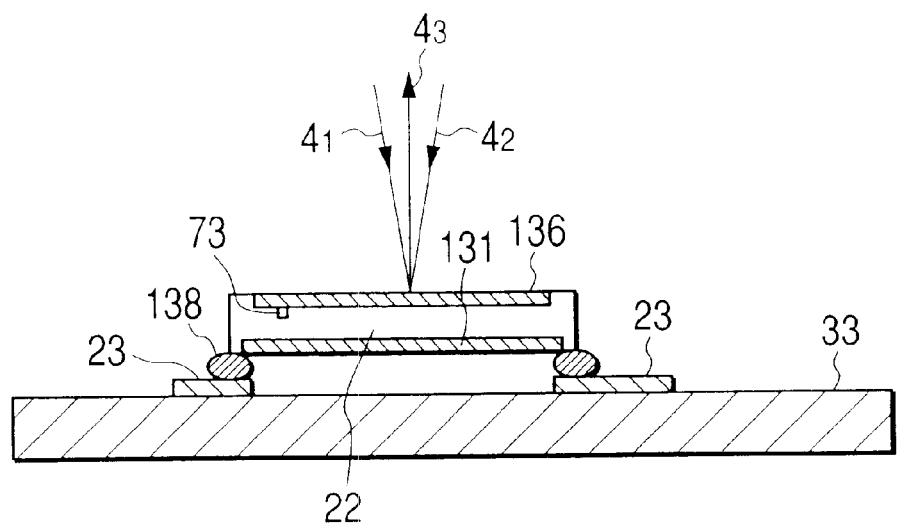
FIG. 10A to FIG. 10D show an example of a method of building a certificate chip in an IC card.

FIG. 10A is a sectional view in case a flip-flop chip 100 for functioning as the certificate chip 22 is built in a wiring pattern 23 provided on the substrate sheet 33 described in relation to FIG. 4A. A wiring pattern 131 for functioning as the certificate chip 22 is connected to the wiring pattern 23 via a bump 138. In this example, a transparent film 136 for protection is stuck on a defect recognition surface at the back of the surface on which the wiring pattern 131 is provided. As described above referring to FIG. 5A and FIG. 5B, it is useful to protect the defect recognition surface with an $SiO_2$ film, however, a surface on which particles which adhere to the surface of the $SiO_2$ film adhere can be kept away from an inside defect detection area by further providing a transparent film outside the above film. Therefore, noise against defect recognition due to the adhesion of particles can be reduced.

Figure 10B:
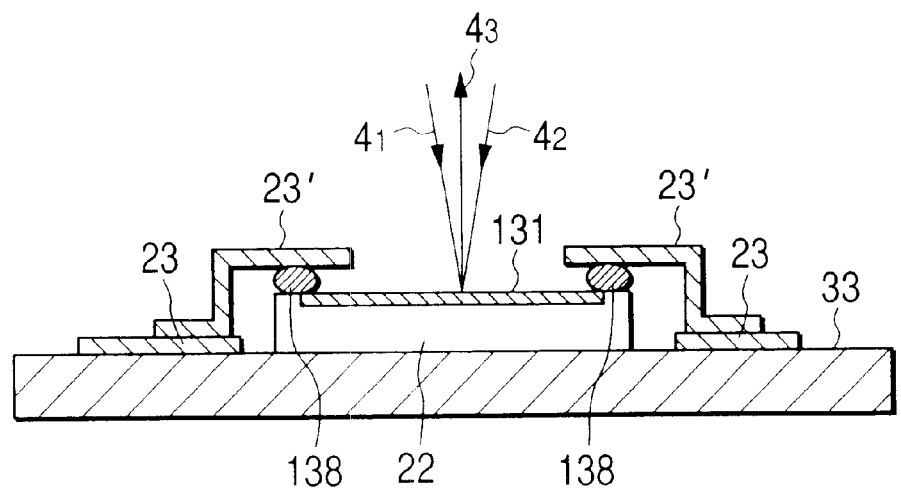

FIG. 10B is a sectional view showing a mounting example in case the wiring pattern 131 itself for making the certificate chip 22 function is utilized for data for setting the area for defect measurement 12. The certificate chip is in a state of a chip-carrier and after wiring 23' for connecting to the wiring pattern 23 is added to the wiring pattern 131, the wiring 23' is connected to the wiring pattern 23.

Figure 10C:
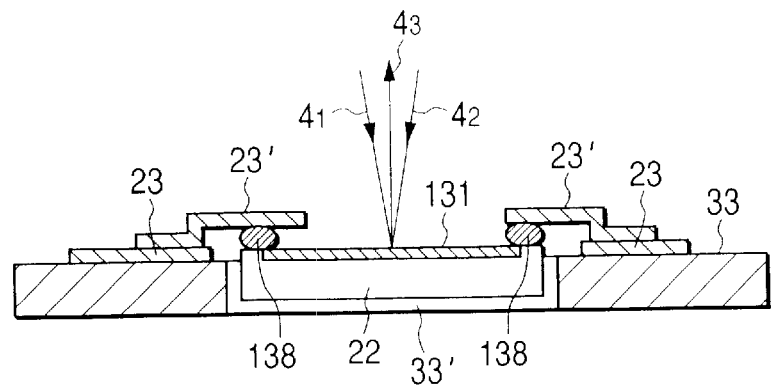

FIG. 10C is a sectional view showing another mounting example in case the wiring pattern 131 itself for making the certificate chip 22 function is utilized for data for setting the area for defect measurement 12. In this example, the certificate chip 22 is embedded in a cutout 33' of the substrate 33. As in FIG. 10B, the certificate chip is in a state of a chip-carrier and after wiring 23' for connecting the wiring pattern 131 on the surface of the certificate chip 22 to the wiring pattern 23 is added, the wiring 23' is connected to the wiring pattern 23.

Figure 10D:
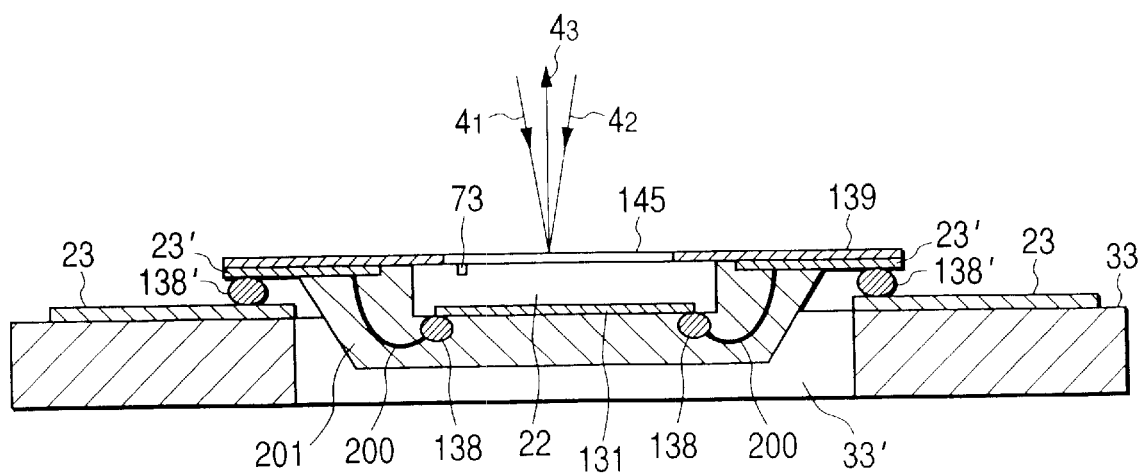

FIG. 10D is a sectional view showing an example in which the certificate chip 22 is mounted on the substrate 33. A reference number 201 denotes molding material for holding the certificate chip 22 on the substrate 33. To use the backface of a surface on which the wiring pattern 131 for making the certificate chip 22 function is provided for a defect recognition surface, a mark 73 is provided on the surface. The certificate chip 22 is mounted on a board 139 so that its defect recognition surface is seen from a cutout 145 of the board 139. A wiring pattern 23' for connecting to wiring 23 on the substrate 33 via a bump 138' is provided on the board 139. The wiring pattern 131 of the certificate chip 22 and the wiring pattern 23' on the board 139 are connected via a bump 138 and wiring 200. In this example, as in FIG. 10C, the certificate chip 22 is also embedded in the cutout 33' of the substrate 33. In this embodiment, there is a merit that a spacer sheet 32 can be thinned.

The above all embodiments are based upon crystal defects in a semiconductor substrate, however, the present invention is not limited to a semiconductor substrate and can be applied to all materials that have crystal defects as a result. The present invention can also be applied to a case wherein an amorphous film is formed on a substrate and a circuit pattern is formed in the film for example.

As described above, the decoding of a code and unfair use by copying can be prevented by using a crystal defect (it is not limited to a crystal and an amorphous defect can be also similarly treated) which is very difficult to artificially produce as a recognition pattern.

In the above embodiments, the contact type IC card is described as an example, however, the present invention can also be applied to a non-contact type IC card. That is, if a card reader is provided with only an optical system for detecting a finger print image and detecting the ID code of the certificate chip has to also be provided, a signal which can be electrically treated can be processed as a non-contact type IC card.

What is claimed is:

1. A method for identifying an article including the steps of:

mounting a semiconductor chip on a surface of said article;

irradiating a plurality of light of various wavelengths on a fixed area of said semiconductor chip;

measuring crystal defects, which have occurred in said semiconductor chip in a semiconductor material production process, in said fixed area of said semiconductor chip;

recording the pattern of measured positions of said crystal defects as an ID code of said article;

measuring crystal defects in a fixed area of a semiconductor chip mounted on an objective article to be identified;

transferring the pattern of measured positions of said crystal defects of said semiconductor chip mounted on said objective article to an ID code;

comparing said ID code with ID codes recorded; and determining that said objective article corresponds to an article which has the same ID code recorded, on condition that said ID code is the same ID code with a recorded ID code.

2. A method for identifying an article according to claim 1, wherein, said ID code is determined according to positions of crystal defects shown on two-dimensional coordinates representing a range divided at a fixed interval in X and Y directions of said fixed area of said semiconductor chip.

3. A method for identifying an article according to claim 2, wherein, said range is represented by a specified mark on the surface of said semiconductor chip.

4. A method for identifying an article according to claim 2, wherein, said range is specified by at least one cutout or projection made on one surface of said semiconductor chip.

5. A method for identifying an article according to claim 1, wherein, said semiconductor chip is made of silicon on an insulator (SOI).

6. A method for identifying an article according to claim 2, wherein, said range is specified by at least one cutout or projection made on one surface of covering material of said semiconductor chip.

7. A method for identifying an article, including the steps of:

mounting a semiconductor chip, in which plural numbers of memory cells are formed, on a surface of said article;

detecting a fail bit pattern of memory cells in a fixed address space of said semiconductor chip;

recording the fail bit pattern of said memory cells as an ID code of said article;

detecting a fail bit pattern of memory cells in a fixed address space of a semiconductor chip mounted on an objective article to be identified;

transferring the fail bit pattern of said memory cells of said semiconductor chip mounted on said objective article to be identified to an ID code;

comparing said ID code with ID codes recorded; and determining that said objective article corresponds to an article which has the same ID code recorded, on condition that said ID code is the same ID code with a recorded ID code.

8. A method for identifying an article according to claim 7, mounting a semiconductor chip, in which plural numbers of memory cells are formed, on a surface of said article;

wherein said fail bit pattern shows good or bad bit results and records the results together with an address, and a method of multivaluing the analog electric characteristic of a device corresponding to one address and recording the one address is enabled.

* * * * *